(12) United States Patent
Yang

(10) Patent No.: US 9,130,516 B2
(45) Date of Patent: Sep. 8, 2015

(54) POP NOISE SUPPRESSION CIRCUIT AND SYSTEM

(71) Applicant: Baoding Yang, Chengdu (CN)

(72) Inventor: Baoding Yang, Chengdu (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 411 days.

(21) Appl. No.: 13/624,825

(22) Filed: Sep. 21, 2012

(65) Prior Publication Data

US 2014/0086432 A1    Mar. 27, 2014

(30) Foreign Application Priority Data

Dec. 16, 2011   (CN) .......................... 2011 1 0422007

(51) Int. Cl.
*H03F 1/30*   (2006.01)
*H03G 3/34*   (2006.01)

(52) U.S. Cl.
CPC ............... *H03F 1/305* (2013.01); *H03G 3/348* (2013.01); *H03F 2200/03* (2013.01)

(58) Field of Classification Search
CPC ...... H03F 1/305; H03F 2200/03; H03G 3/348
See application file for complete search history.

(56) References Cited

U.S. PATENT DOCUMENTS

| 5,939,938 | A  | * | 8/1999  | Kalb et al. ....................... 330/51  |
| 8,526,636 | B1 | * | 9/2013  | Pai et al. ........................ 381/94.5 |
| 2004/0161123 | A1 | * | 8/2004  | Komiya et al. ................ 381/120 |
| 2007/0229169 | A1 | * | 10/2007 | Doy et al. ...................... 330/297 |
| 2011/0261976 | A1 | * | 10/2011 | Lu ................................. 381/94.5 |

* cited by examiner

*Primary Examiner* — Fan Tsang
*Assistant Examiner* — Eugene Zhao

(57) ABSTRACT

A POP noise suppression circuit includes a power source terminal, a clock signal input terminal, a charge unit, a discharge unit, a common-mode voltage judging and switching control unit, a charge and discharge capacitor, and a ground terminal. The charge unit includes a first clock generation circuit for generating a first pair of non-overlapped clock signal, and a first equivalent resistor. The discharge unit includes a second clock generation circuit for generating a second pair of non overlapped clock signals, and a second equivalent resistor. The charge unit generates a charge voltage changing slowly to the charge and discharge capacitor. The discharge unit generates a discharge voltage changing slowly to the charge and discharge capacitor. A POP noise suppression system is further provided.

10 Claims, 2 Drawing Sheets

POP NOISE SUPPRESSION CIRCUIT AND SYSTEM

BACKGROUND OF THE PRESENT INVENTION

1. Field of Invention

The present invention relates to an audio processing circuit and system, and more particularly to a POP noise suppression circuit having a simple structure, requiring no plug-in capacitor, and capable of suppressing POP noise, and a POP noise suppression system thereof.

2. Description of Related Arts

POP noise refers to noise that commonly exists in an audio system and is generated in a start-up or shutdown process.

In a start-up process of an audio system, an input and output voltage of the audio system during static operating is needed to be charged to a common-mode voltage; while in a shutdown process, the input and output voltage thereof is needed to be discharged to 0. Thus, in a start-up or shutdown process, a speaker or headphone driven by a driving terminal is easily to be impulsed to generate POP noise, which leads to discomfort of sensitive ears.

In the prior art, a plug-in capacitor of large capacitance is usually required to suppress POP noise, which increases the design cost in a large extent. Thus, it is necessary to provide a POP noise suppression circuit having a simple structure, requiring no plug-in capacitor, and capable of suppressing POP noise effectively, and a POP suppression system thereof.

SUMMARY OF THE PRESENT INVENTION

In view of the descriptions mentioned above, it is necessary to provide a POP noise suppression circuit having a simple structure, requiring no plug-in capacitor, and capable of suppressing POP noise effectively, and a POP noise suppression system thereof.

A POP noise suppression circuit for an audio system, comprises:

a power source terminal,
a clock signal input terminal,
a charge unit connected with the power source terminal and the clock signal input terminal,
a discharge unit connected with the power source terminal, the clock signal input terminal and the charge unit,
a common-mode voltage judging and switching control unit connected with the charge unit and the discharge unit,
a charge and discharge capacitor connected with the charge unit, the discharge unit, and the common-mode voltage judging and switching control unit, and
a ground terminal connected with the discharge unit, the discharge unit, and the charge and discharge capacitor,
wherein the charge unit comprises a first clock generation circuit connected with the clock signal input terminal and the common-mode voltage judging and switching control module for generating a first pair of non-overlapped clock signals, and a first equivalent resistor connected with the first clock generation circuit,
the discharge unit comprises a second clock generation circuit connected with the clock signal input terminal and the common-mode voltage judging and switching control unit for generating a second pair of non overlapped clock signals, and a second equivalent resistor connected with the second clock generation circuit,
the common-mode voltage judging and switching control module judges that whether a voltage of the charge and discharge capacitor reaches to the common-mode voltage, and switches working between the first clock generation circuit in the charge unit and the second clock generation circuit in the discharge unit,
the charge unit generates a charge voltage changing slowly to the charge and discharge capacitor,
the discharge unit generates a discharge voltage changing slowly to the charge and discharge capacitor.

A POP noise suppression system for an audio system, comprises:

a power source terminal,
a clock signal input terminal for inputting a clock signal,
a charge unit connected with the power source terminal and the clock signal input terminal,
a discharge unit connected with the power source terminal, the clock signal input terminal and the charge unit,
a common-mode voltage judging and switching control unit connected with the charge unit and the discharge unit,
a charge and discharge capacitor connected with the charge unit, the discharge unit, and the common-mode voltage judging and switching control unit, and
a ground terminal connected with the charge unit, the discharge unit, and the charge and discharge capacitor,
wherein the discharge unit and the charge and discharge capacitor form an RC charge circuit, the discharge unit and the charge and discharge capacitor form an RC discharge circuit,
the common-mode voltage judging and switching control unit judges that whether a voltage of the charge and discharge capacitor reaches to a common-mode voltage, and switches working between the charge unit and the discharge unit,
the charge unit generates a charge voltage changing slowly to the charge and discharge capacitor, and the discharge unit generates a discharge voltage changing slowly to the charge and discharge capacitor.

Compared with the prior art, the POP noise suppression circuit and system according to preferred embodiment of the present invention have simple structures, and are capable of generating the charge voltage and discharge voltage changing slowly, so as to effectively suppress POP noise generated in a start-up or shutdown process in the audio system.

These and other objectives, features, and advantages of the present invention will become apparent from the following detailed description, the accompanying drawings, and the appended claims.

DETAILED DESCRIPTION OF THE PREFERRED EMBODIMENT

Figure 1:
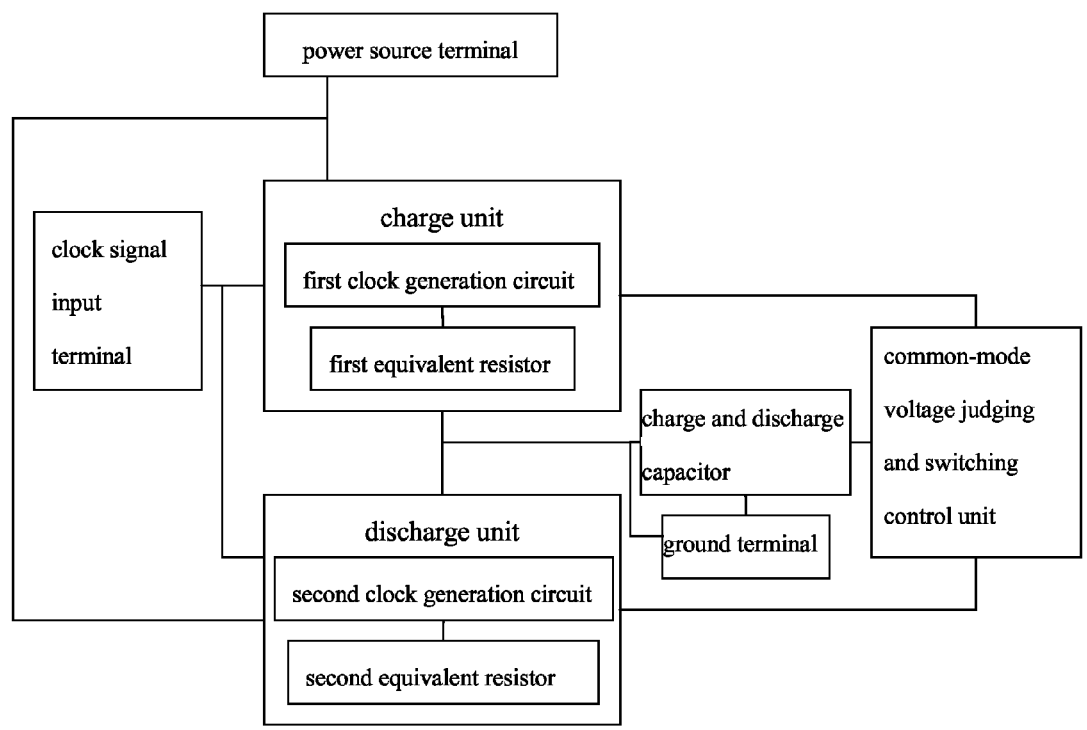
FIG. 1 is a block diagram of a POP noise suppression system according to a preferred embodiment of the present invention.

Referring to FIG. 1 of the drawings, a POP noise suppression system according to a preferred embodiment of the present invention is illustrated, comprising:

a power source terminal,
a clock signal input terminal,
a charge unit connected with the power source terminal and the clock signal input terminal,
a discharge unit connected with the power source terminal, the clock signal input terminal and the charge unit, a common-mode voltage judging and switching control unit connected with the charge unit and the discharge unit, a charge and discharge capacitor connected with the charge unit, the discharge unit, and the common-mode voltage judging and switching control unit, and a ground terminal, wherein the charge unit comprises a first clock generation circuit connected with the clock signal input terminal and the common-mode voltage judging and switching control module for generating a first pair of non-overlapped clock signals, and a first equivalent resistor connected with the first clock generation circuit, and the discharge unit comprises a second clock generation circuit connected with the clock signal input terminal and the common-mode voltage judging and switching control unit for generating a second pair of non-overlapped clock signals, and a second equivalent resistor connected with the second clock generation circuit.

The power source terminal is for providing the POP noise suppression system with a supply voltage required. The clock signal input terminal is for providing the first clock generation circuit and the second clock generation circuit with a clock signal. The charge unit is for charging the charge and discharge capacitor, and generating a charge voltage changing slowly. The discharge unit is for discharging the charge and discharge capacitor and generating a discharge voltage changing slowly. The common-mode voltage judging and switching control unit is for judging that whether a voltage of the charge and discharge capacitor reaches to a common-mode voltage while charging, and that whether the voltage of the charge and discharge capacitor reaches to 0, and switching working between the charge unit and the discharge unit.

Figure 2:
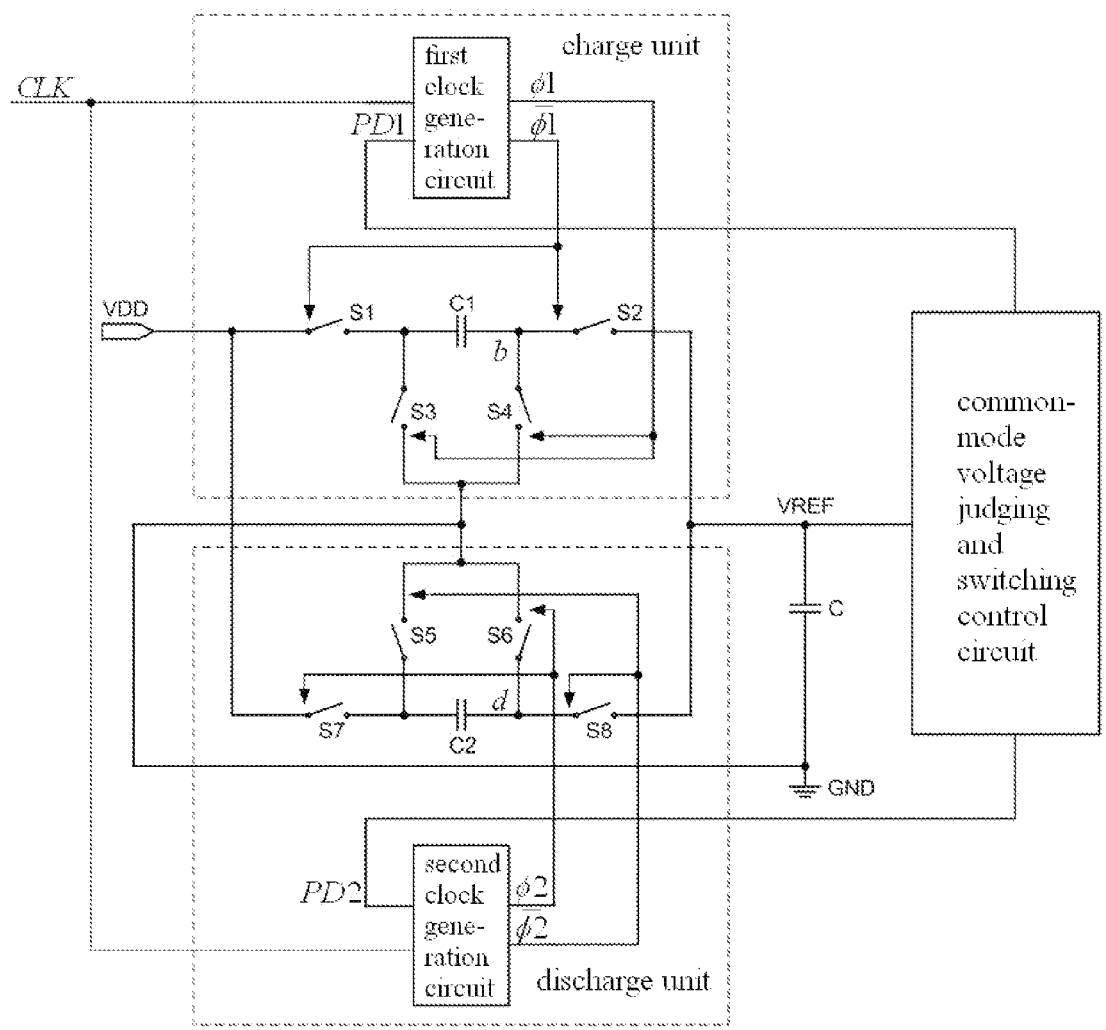
FIG. 2 is a circuit diagram of a POP noise suppression circuit according to a preferred embodiment of the present invention.

Further referring to FIG. 2, a circuit diagram of the POP noise suppression circuit according to a preferred embodiment of the present invention is illustrated. The power source terminal is embodied as VDD. The clock signal input terminal is embodied as CLK. The charge and discharge capacitor is embodied as C. The ground terminal is embodied as GND. The first clock generation circuit has a first output terminal $\phi1$ and a second output terminal $\overline{\phi1}$, the first output terminal $\phi1$ and the second output terminal $\overline{\phi1}$ together generate a first pair of non-overlapped clock signals. The second clock generation circuit has a third output terminal $\phi2$ and a fourth output terminal $\overline{\phi2}$, the third output terminal $\phi2$ and the fourth output terminal $\overline{\phi2}$ together generate a second pair of non-overlapped clock signals. The first equivalent resistor comprises a first switch S1, a second switch S2, a third switch S3, a fourth switch S4, and a first capacitor C1. Opening and closing of the first switch S1 and the second switch S2 are controlled by a clock signal output by the second output terminal $\overline{\phi1}$, opening and closing of the third switch S3 and the fourth switch S4 are controlled by a clock signal output by the first output terminal $\phi1$. The second equivalent resistor comprises a fifth switch S5, a sixth switch S6, a seventh switch S7, an eighth switch S8, and a second capacitor C2. Opening and closing of the fifth switch S5 and the eighth switch S8 are controlled by a clock signal output by the fourth output terminal $\overline{\phi2}$. Opening and closing of the sixth switch S6 and the seventh switch S7 are controlled by a clock signal output by the third output terminal $\phi2$. The common mode voltage judging and switching control unit comprises a first control terminal PD1 for controlling operation of the charge circuit, and a second control terminal PD2 for controlling operation of the discharge circuit.

Specific circuit connections of the POP suppression circuit according to the preferred embodiment of the present invention are as following.

The power source terminal VDD is connected with a first terminal of the first switch S1 and a first terminal of the seventh switch S7, a second terminal of the first switch S1 is connected with a first terminal of the third switch S3 and a first terminal of the first capacitor C1, and a second terminal of the first capacitor C1 is connected with a first terminal of the second switch S2 and a first terminal of the fourth switch S4.

A second terminal of the seventh switch S7 is connected with a first terminal of the fifth switch S5 and a first terminal of the second capacitor C2, a second terminal of the second capacitor is connected with a first terminal of the sixth switch S6 and a first terminal of the eighth switch S8.

A second terminal of the second switch S2, a second terminal of the eighth switch S8, a first terminal of the charge and discharge capacitor C, and an input terminal of the common-mode voltage judging and switching control unit are all connected with a common-mode voltage terminal VREF.

A first control terminal PD1 of the common-mode voltage judging and switching control unit is connected with a control terminal of the first clock generation circuit, and a second control terminal PD2 of the common-mode voltage judging and switching control unit is connected with a control terminal of the second clock generation circuit.

The clock signal input terminal CLK is connected with a clock input terminal of the first clock generation circuit, and a clock input terminal of the second clock generation circuit.

A second terminal of the third switch S3, a second terminal of the fourth switch S4, a second terminal of the fifth switch S5, a second terminal of the sixth switch S6 and a second terminal of the charge and discharge capacitor C are all connected with the ground terminal GND.

Working principles of the POP noise suppression circuit and system according to preferred embodiments of the present invention are analyzed as following.

When powering on, i.e., a start-up signal of the circuit is sent out, a first control terminal PD1 of the common-mode judgment and switching control unit is at a low level, and a second terminal PD2 thereof is at a high level. The first clock generation of the charge unit starts to work, and charges the charge and discharge capacitor C. When the charge and discharge capacitor C is charged to a common-mode voltage, i.e., 0.5 VDD, the first control terminal PD1 of the common-mode judgment and switching control unit switches to be at a high level, the second control terminal PD2 thereof still maintains at high level. By this time, charging process is finished, and the circuit is in normal operation.

When powering off, i.e., a shutdown signal of the circuit is sent out, a first control terminal PD1 of the common-mode judgment and switching control unit is at a high level, and a second terminal PD2 thereof is at a low level. The second clock generation of the discharge unit starts to work, and discharges the charge and discharge capacitor C. When the charge and discharge capacitor C is discharged to be at a zero level, i.e., the first control terminal PD1 of the common-mode judgment and switching control unit still maintains at a high level, the second control terminal PD2 thereof switches to be at a high level. By this time, discharging process is finished, and the circuit is shutdown.

A well known RC charge and discharge circuit is capable of generating a charge and discharge voltage curve changing slowly, and the charge unit in the POP noise suppression circuit according to the preferred embodiment of the present invention is equivalent to an RC charge circuit, the discharge unit thereof is equivalent to an RC discharge circuit, so the charge and discharge curve changing slowly is capable of being generated via the RC charge and discharge circuit, so as to suppress POP noise. Specific analysis is as following.

A complete response of a well known RC circuit to a step signal is $V_C$, $$V_C = V_S + (V_{uc0} - V_S)e^{-t/RC}, t \geq 0, \quad (1),$$

wherein $V_C$ is a voltage between two terminals of a capacitor, $V_S$ is a voltage value of the step signal at a high or low level, i.e., the charge or discharge voltage, $V_{uc0}$ is an initial voltage between the two terminals of the capacitor, e is a constant, t is response time.

In an integrated circuit, a capacitor of large capacitance occupies a large chip area, so the charge and discharge capacitor is usually at a PF level. If a common RC charge and discharge circuit is adopted, and a slop of hundreds of milliseconds is needed to be generated, value of a resistance is required to be dozens of Gs, which is incapable of being achieved in the integrated circuit. Adopting a switched capacitor, the POP noise suppression circuit and system, according to the preferred embodiment of the present invention, are capable of generating a discrete-time resistance. FIG. 2 shows that an absolute value of the first equivalent resistor of the charge unit is $R_{char} = 1/(fC_{S1})$, an absolute value of the second equivalent resistor of the discharge unit is $R_{disc} = 1/(fC_{S2})$, wherein f is a clock frequency, Cs1 is a capacitance value of the first capacitor C1, Cs2 is a capacitance value of the second capacitor C2, and Cs2=0.584Cs1, so it shows that an equivalent large resistance is capable of being generated so long as an appropriate clock frequency and capacitor are chosen. It can be seen that the charge unit and the discharge unit of the POP noise suppression circuit according to a preferred embodiment of the present invention are capable of being respectively considered as RC circuits. Thus, so the charge and discharge curve changing slowly is capable of being generated via the RC charge and discharge circuit, so as to suppress POP noise.

According to the charge conservation law, for the charge unit:

$$(VDD - Vb)*Cs1 = 0*Cs1, \quad (2)$$

so Vb=VDD is obtained;
for the discharge unit:

$$(VDD - 0)*Cs2 = (0 - Vd)*Cs1, \quad (3)$$

so Vd=−VDD is obtained;
wherein Vb is a voltage at a point b shown in FIG. 2, Vd is a voltage at a point d shown in FIG. 2.

Thus, the charge unit of the present invention is equivalent to charging a charge and discharge capacitor having an initial value of 0 by a power supply voltage; and the discharge unit thereof is equivalent to charging a charge and discharge capacitor having an initial value of 0.5 VDD by a negative power supply voltage, which is equivalent to a discharge process.

Respectively putting the expressions (2) and (3) to the expression (1), it is obtained that a time period that the charge unit is charged to 0.5 VDD is Tup, $$Tup = 0.693 Rchar*C = 0.693 C/(f*Cs1), \quad (4),$$

and that a time period that the discharge unit is discharged from 0.5 VDD to 0 is Tdown, $$Tdown = 0.405 Rdisc*C = 0.405 C/(f*Cs2), \quad (5)$$

It can be seen from the descriptions mentioned above that the charge time and the discharge time are capable of being controlled so long as the clock frequency f or the charge and discharge capacitor C is adjusted, so as to generate the charge voltage and discharge voltage changing slowly required.

The POP noise suppression circuit and system according to preferred embodiments of the present invention have simple structures, and are capable of generating the charge voltage and discharge voltage changing slowly requiring no plug-in capacitor, so as to effectively suppress the POP noise generated in a start-up or shutdown process of an audio system.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A POP noise suppression circuit for an audio system, comprising:
   a power source terminal,
   a clock signal input terminal,
   a charge unit connected with said power source terminal and said clock signal input terminal,
   a discharge unit connected with said power source terminal, said clock signal input terminal and said charge unit,
   a common-mode voltage judging and switching control unit connected with said charge unit and said discharge unit,
   a charge and discharge capacitor connected with said charge unit, said discharge unit, and said common-mode voltage judging and switching control unit, and
   a ground terminal connected with said charge unit, said discharge unit, and said charge and discharge capacitor,
   wherein said charge unit comprises a first clock generation circuit connected with said clock signal input terminal and said common-mode voltage judging and switching control module for generating a first pair of non-overlapped clock signals, and a first equivalent resistor connected with said first clock generation circuit,
   said discharge unit comprises a second clock generation circuit connected with said clock signal input terminal and said common-mode voltage judging and switching control unit for generating a second pair of non overlapped clock signals, and a second equivalent resistor connected with said second clock generation circuit,
   said common-mode voltage judging and switching control module judges that whether a voltage of said charge and discharge capacitor reaches to a common-mode voltage, and switches working between said first clock generation circuit in said charge unit and said second clock generation circuit in said discharge unit,
   said charge unit generates a charge voltage changing slowly to said charge and discharge capacitor,
   said discharge unit generates a discharge voltage changing slowly to said charge and discharge capacitor.

2. The POP noise suppression circuit, as recited in claim 1, wherein said first clock generation circuit has a first output terminal and a second output terminal, said first output terminal and said second output terminal together generate a first pair of non-overlapped clock signals; said second clock generation circuit has a third output terminal and a fourth output terminal, said third output terminal and said fourth output terminal together generate a second pair of non-overlapped clock signals.

3. The POP noise suppression circuit, as recited in claim 2, wherein said first equivalent resistor comprises:
   a first switch and a second switch which are connected with said power source terminal,
   a third switch connected with said first switch,
   a fourth switch connected with said second switch and said third switch, and
   a first capacitor connected between said first switch and said second switch,
   wherein opening and closing of said first and second switches are controlled by a clock signal output by said second output terminal, and opening and closing of said third and fourth switches are controlled by a clock signal output by said first output terminal.

4. The POP noise suppression circuit, as recited in claim 3, wherein said second equivalent resistor comprises:
   a fifth switch connected with said third switch and said fourth switch,
   a sixth switch connected with said fifth switch,
   a seventh switch connected with said sixth switch,
   an eighth switch connected with said sixth switch, and
   a second capacitor connected between said seventh switch and said eighth switch,
   wherein opening and closing of said fifth and eighth switches are controlled by a clock signal output by said fourth output terminal, and opening and closing of said sixth and seventh switches are controlled by a clock signal output by said third output terminal,
   wherein said common-mode voltage judging and switching control unit comprises a first control terminal connected with said first clock generation circuit, and a second control terminal connected with said second clock generation circuit.

5. The POP noise suppression circuit, as recited in claim 4, wherein said power source terminal is connected with a first terminal of said first switch and a first terminal of said seventh switch, a second terminal of said first switch is connected with a first terminal of said third switch and a first terminal of said first capacitor, a second terminal of said first capacitor is connected with a first terminal of said second switch and a first terminal of said fourth switch, a second terminal of said seventh switch is connected with a first terminal of said fifth switch and a first terminal of said second capacitor, a second terminal of said second capacitor is connected with a first terminal of said sixth switch and a first terminal of said eighth switch.

6. The POP noise suppression circuit, as recited in claim 5, wherein a second terminal of said second switch, a second terminal of said eighth switch, a first terminal of said charge and discharge capacitor, and an input terminal of said common-mode voltage judging and switching control unit are all connected with a common-mode voltage terminal, a first control terminal of said common-mode voltage judging and switching control unit is connected with a control terminal of said first clock generation circuit, a second control terminal of said common-mode voltage judging and switching control unit is connected with a control terminal of said second clock generation circuit.

7. The POP noise suppression circuit, as recited in claim 6, wherein
   said clock signal input terminal is connected with a clock input terminal of said first clock generation circuit, and a clock input terminal of said second clock generation circuit, a second terminal of said third switch, a second terminal of said fourth switch, a second terminal of said fifth switch, a second terminal of said sixth switch and a second terminal of said charge and discharge capacitor are all connected with said ground terminal.

8. A POP noise suppression system, which is used in an audio system, comprising:
   a power source terminal,
   a clock signal input terminal for inputting a clock signal,
   a charge unit connected with the power source terminal and the clock signal input terminal,
   a discharge unit connected with the power source terminal, the clock signal input terminal and the charge unit,
   a common-mode voltage judging and switching control unit connected with the charge unit and the discharge unit,
   a charge and discharge capacitor connected with the charge unit, the discharge unit, and the common-mode voltage judging and switching control unit, and
   a ground terminal connected with the charge unit, the discharge unit, and the charge and discharge capacitor,
   wherein the discharge unit and the charge and charge capacitor form a resistor capacitor (RC) charge circuit, and the discharge unit and the charge and discharge capacitor form an RC discharge circuit,
   the common-mode voltage judging and switching control unit judges whether a voltage of the charge and discharge capacitor reaches to the common-mode voltage, and switches working between the charge unit and the discharge unit,
   the charge unit generates a charge voltage changing slowly to the charge and discharge capacitor, and the discharge unit generates a discharge voltage changing slowly to the charge and discharge capacitor.

9. The POP noise suppression system, as recited in claim 8, wherein
   said charge unit comprises a first clock generation circuit connected with said clock signal input terminal and said common-mode voltage judging and switching control module for generating a first pair of non-overlapped clock signals, and a first equivalent resistor connected with said first clock generation circuit,
   said discharge unit comprises a second clock generation circuit connected with said clock signal input terminal and said common-mode voltage judging and switching control unit for generating a second pair of non overlapped clock signals, and a second equivalent resistor connected with said second clock generation circuit.

10. The POP noise suppression system, as recited in claim 9, wherein said first equivalent resistor comprises:
   a first switch and a second switch which are connected with said power source terminal,
   a third switch connected with said first switch,
   a fourth switch connected with said second switch and said third switch, and
   a first capacitor connected between said first switch and said second switch,
   wherein said second said second equivalent resistor comprises:
   a fifth switch connected with said third switch and said fourth switch,
   a sixth switch connected with said fifth switch,
   a seventh switch connected with said fifth switch,
   an eighth switch connected with said sixth switch, and a second capacitor connected between said seventh switch and said eighth switch.

* * * * *